(12) United States Patent
Chen

(10) Patent No.: US 6,383,901 B1
(45) Date of Patent: May 7, 2002

(54) METHOD FOR FORMING THE ULTRA-SHALLOW JUNCTION BY USING THE ARSENIC PLASMA

(75) Inventor: Wei-Wen Chen, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/768,289

(22) Filed: Jan. 25, 2001

(51) Int. Cl.[7] .............................................. H01L 21/425
(52) U.S. Cl. ........................................ 438/514; 438/663
(58) Field of Search .............................. 438/181, 194, 438/301, 369, 508, 513, 514, 510, 535, 558, 621, 663

(56) References Cited

U.S. PATENT DOCUMENTS

| | | | | |
|---|---|---|---|---|
| 5,270,250 A | * | 12/1993 | Murai et al. | 438/513 |
| 5,672,541 A | * | 9/1997 | Booske et al. | 438/513 |
| 6,165,858 A | * | 12/2000 | Gardner et al. | 438/305 |
| 6,258,682 B1 | * | 7/2001 | Tseng | 438/305 |

* cited by examiner

*Primary Examiner*—David Nelms
*Assistant Examiner*—David Nhu

(57) ABSTRACT

This invention relates to a method for forming a shallow junction, more particularly, to the method for forming a ultra-shallow junction by using a arsenic plasma doping fashion. The present invention uses the arsenic plasma doping fashion to dope arsenic ions to the junction of the semiconductor and then passes through a post anneal process. The resistance value of the junction can be controlled. The present invention also uses the depth of doped arsenic ions to control the depth of the junction and to restrain the diffusion of the arsenic ions. Then the region of the junction can be reduced successfully to become a ultra-shallow junction. This ultra-shallow junction is a low resistance value and excellent electricity junction.

9 Claims, 4 Drawing Sheets

METHOD FOR FORMING THE ULTRA-SHALLOW JUNCTION BY USING THE ARSENIC PLASMA

BACKGROUND OF THE INVENTION

1. Field of the Invention

This invention relates to a method for forming a shallow junction, more particularly, to the method for forming a ultra-shallow junction by using a arsenic plasma doping fashion. The present invention uses the arsenic plasma doping fashion to dope arsenic ions to the junction of the semiconductor and then passes through a post anneal process to reduce the region of the junction successfully. The junction will become a low resistance ultra-shallow junction.

2. Description of the Prior Art

In general, in a semiconductor device, a semiconductor element is formed by providing an impurity diffusion layer in a semiconductor substrate. The impurity diffusion layer is provided by forming, for example, an $SiO_2$ film, on a surface of a semiconductor substrate by a thermal oxidation method, patterning the $SiO_2$ film by photolithography technology, and carrying out a selective thermal-diffusion of impurities or an ion-implantation using the $SiO_2$ film as a mask.

The thermal diffusion process, however, comprises an annealing step at a high temperature, and thus impurities are diffused not only in the depth direction but also in the width direction. Consequently, it is difficult to control the diffusion of the impurities only in the depth direction. Particularly, when for example, an impurity having a large diffusion coefficient, for example, boron (B), is diffused, the impurity diffusion in both the width and depth directions is large, and thus a shallow junction can not be easily formed.

In the ion implanting process, the annealing process required for activating impurities and recovering damage takes a long time, thereby causing a redistribution of the implanted ions and the occurrence of a channeling phenomenon due to a particular crystalline orientation. Consequently, it is also difficult to form a shallow junction by ion-implantation, as it is in the above-mentioned thermal diffusion process.

When the shallow junction is formed by using the traditional ion-implantation technology, the energy of the ion-implantation is ultra-low. The energy of the beam current of this ion-implantation is about lower than 1000 kilo-electric voltage (keV). The energy of this implanted beam current is over low and is a tenth of the last generation technology. This condition will affect the throughput seriously. Therefore, the traditional method can not be almost used in the modern process, which emphasizes the output ability of the unit space.

In the traditional ion-implantation technology, we also use the wafer tilt way to implant ions into the whole junction. But in the wafer tilt ion-implantation process, the implanted ions in the junctions, which are on the both side of the gate, are not the same. This condition will make the resistance values of the both junctions be non-uniform and will affect the quality of the productions. This condition will also decrease the throughput because of adding the wafer tilt process. Therefore, In accordance with the above statement, the traditional ion-implantation method is not suitable to produce the shallow junction. Especially the main objective of the present semiconductor process is to reduce the volume of the semiconductor element and to increase the density of the semiconductor elements in the semiconductor. When the volume of the element is reduced, the region of the junction must be following reduced to become the ultra-shallow junction. The functions of the element and the throughput of the factory must be also maintained. Therefore, the present invention is used for producing the ultra-shallow junction in the semiconductor, reducing the resistance value of the ultra-shallow junction, and not affecting the throughput of the process.

SUMMARY OF THE INVENTION

In accordance with the above-mentioned invention backgrounds, the traditional ion-implantation method can not form the needed ultra-shallow junction. The main objective of the present invention is to provide a method for forming the ultra-shallow junction by using a arsenic plasma doping fashion to control the region of the ultra-shallow Junction. The present invention will reduce the region of the ultra-shallow junction successfully and not affect the electricity of the ultra-shallow junction.

The second objective of this invention is to prevent the arsenic ions diffusing to the outside of the needed depth in the post anneal process by using the arsenic plasma doping fashion to form the ultra-shallow junction.

The third objective of this invention is to reduce the spending time of the post anneal process to increase the throughput of the process by using the arsenic plasma doping fashion to form the ultra-shallow junction.

The fourth objective of this invention is to make the resistance of the ultra-shallow junctions which are on the both sides of the gate be the same by using the arsenic plasma doping fashion to form the ultra-shallow junction.

It is a further objective of this invention is to reduce the resistance value of the ultra-shallow junction and increase the qualities of the formed ultra-shallow junction by using the arsenic plasma doping fashion to form the ultra-shallow junction.

In according to the foregoing objectives, The present invention provide a method for forming a ultra-shallow junction by using the arsenic plasma doping fashion and then passing through a post anneal process. The depth of the doped arsenic ions in the semiconductor are controlled following the needs of the process to make the region of the junction be reduced following the reduced volume of the semiconductor elements to become the ultra-shallow junction. The electricity of the ultra-shallow junction which is formed by using the present invention method is better and the resistance value of the ultra-shallow junctions which are on the both sides of the gate is more uniform. The method of the present invention even more can reduce the proceeding time of the producing the ultra-shallow junction process, raise the throughput, and increase the qualities of the ultra-shallow junction.

BRIEF DESCRIPTION OF THE DRAWINGS

In the accompanying drawing forming a material part of this description, there is shown.

DESCRIPTION OF THE PREFERRED EMBODIMENT

The foregoing aspects and many of the attendant advantages of this invention will become more readily appreciated as the same becomes better understood by reference to the following detailed description, when taken in conjunction with the accompanying drawings, wherein:

The traditional method in making junction is using ion-implantation method to implant ions into the semiconductor substrate at first, and then pass through a post anneal process to form a junction. But in the ion-implantation process, we usually use more energy and destroy the surface material structure of the semiconductor substrate. This condition will cause that we must spend more time to repair and to restore the surface material structure of the semiconductor substrate in the post anneal process. The implanted ions are not controlled easily to cause the diffusion region to be over depth or over width in the post anneal process to affect the electricity of the semiconductor elements. Therefore, the ion-implantation method can not be the method for forming the ultra-shallow junction. If we use the ultra-low energy ion-implantation method and add the wafer tilt implantation mode, perhaps we can improve the defects of the above statement. However, the implanted beam current is over low to decrease the throughput of the making ultra-shallow junction process. And using the wafer tilt implantation mode will easily cause the ions to distribute non-uniformly in the junctions, which are on the both sides of the gate, and will result in uniform resistance value. Therefore, this method can not be the forming ultra-shallow junction method even more and then we must use the present invention method to form the ultra-shallow junction.

Figure 1:
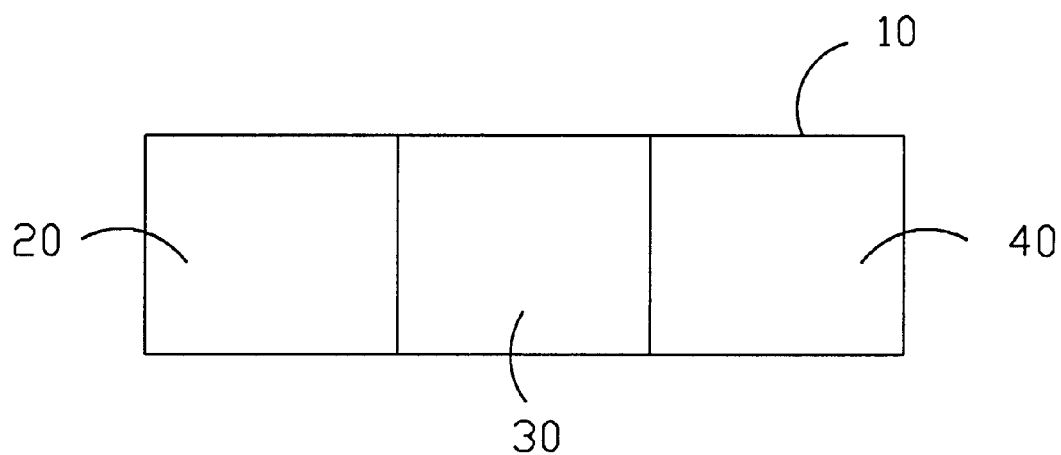
FIG. 1 shows a diagram in dividing the wafer substrate into the gate region, the source region, and the drain region.
Figure 2:
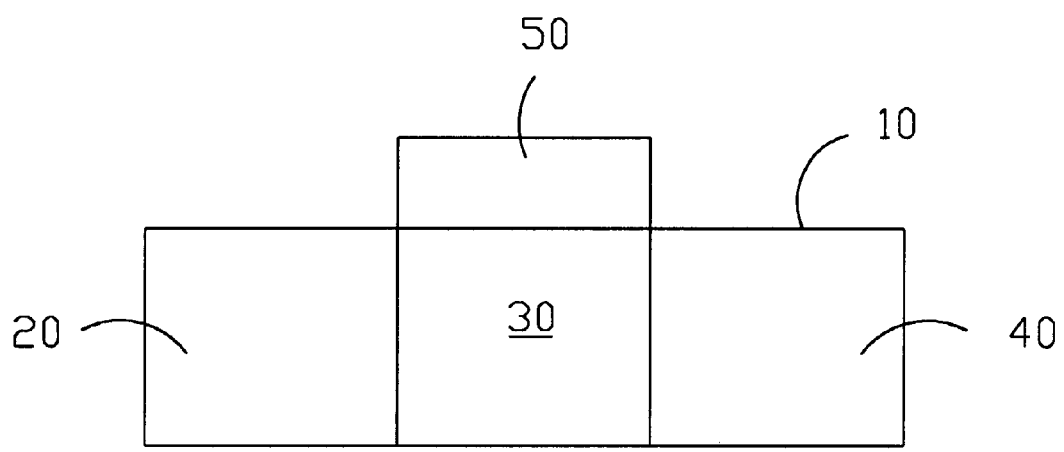
FIG. 2 shows a diagram in forming a mask on the gate region.

The present invention method is to dope the arsenic ions into the semiconductor substrate by using plasma doping method to form a ultra-shallow junction. The following embodiment is to use the present invention method to form the junctions in the p type metal oxide semiconductor (PMOS) and can not limit the using region of the present invention method. Referring to FIG. 1, this is a wafer, which comprises a p type substrate. At first, we must divide the p type substrate into a gate region 30, a source region 20, and a drain region 40. Referring to FIG. 2, a mask layer 50 is formed over the gate region 30 to prevent the doped ions entering to the gate region 30 of the p type substrate in the following ion-doping process to affect the electricity of the produced semiconductor elements.

Figure 3:
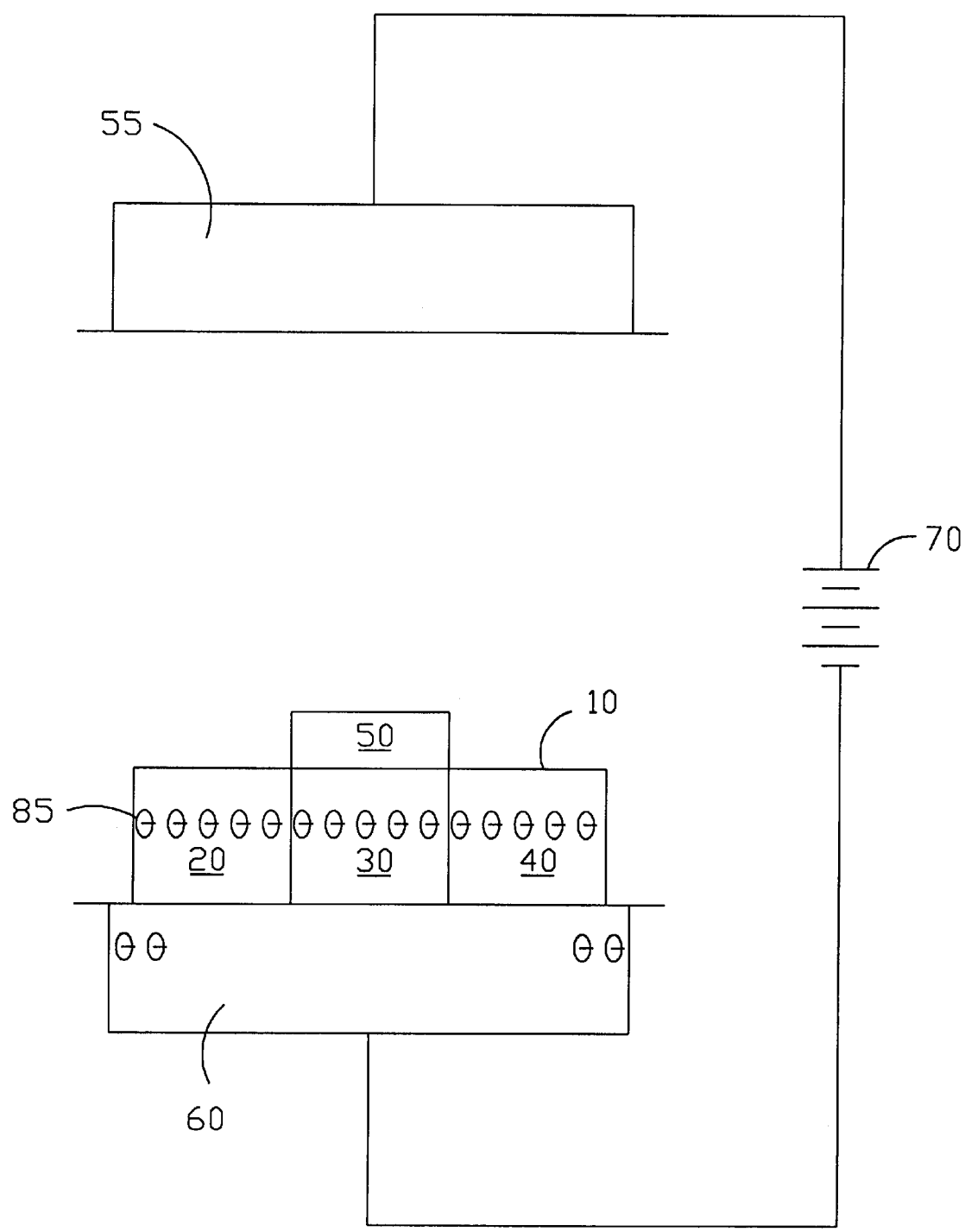
FIG. 3 shows a diagram in locating the wafer in the chamber, opening the power supply, and transmitting the gas which comprises arsenic ions.

Referring to FIG. 3, the wafer 10 wherein the mask layer 50 is formed on the gate region 30 of the p type substrate is sent to a chamber. The chamber comprises a first electrode board 55, a second electrode board 60, and a power supply 70. The wafer 10 is located on the second electrode board 60 and then the power supply 70 is opened to make the first electrode board 55, the second electrode board 60, and the wafer 10 bring the electric charge. The present embodiment is to form the junction in the p type metal oxide semiconductor. In order to attract the arsenic ions, which bring the positive charges, to be doped into the wafer 10 surface, the second electrode board 60 and the wafer 10 bring negative charges 85 and the first electrode board 55 brings positive charges after the power supply 70 is opened.

Figure 4:
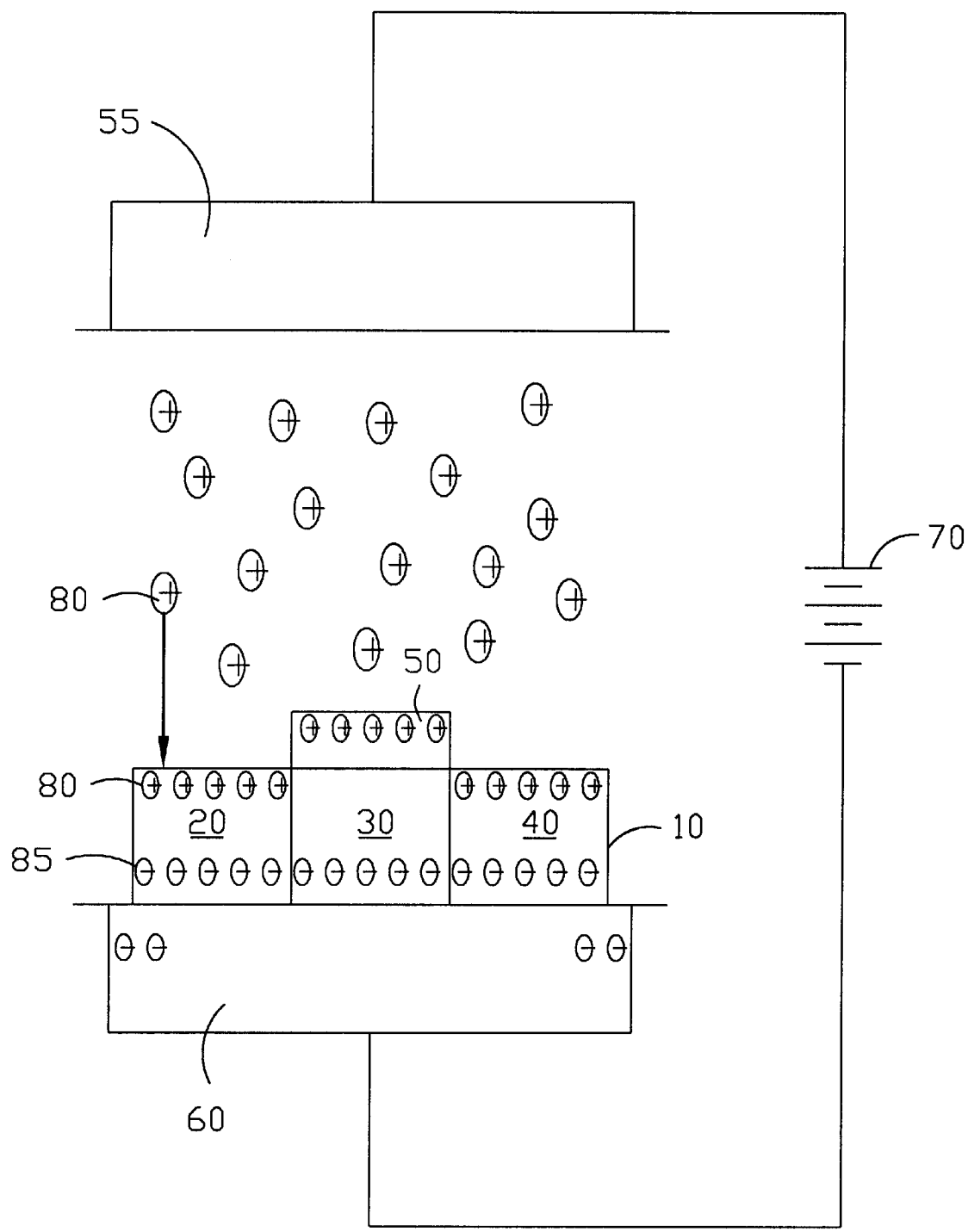
FIG. 4 shows a diagram in doping the arsenic ions into the surface of the wafer.

Referring to FIG. 4, after the power supply 70 is opened and form an electric field on the space between the first electrode board 55 and the second electrode board 60, a gas which comprises arsenic ions is transmitted. The gas passes through the electric field and is decomposed ions quickly. The arsenic ions 80, which bring positive charges, will be attracted with the wafer 10 and the second electrode board 60 which bring negative charges 85 and will be adsorbed on the surface of the wafer 10 and the second electrode board 60. The arsenic ions 80 are doped into the wafer 80 by the osmosis. When the gas is transmitted, the flow rate of the gas is about 10 to 1000 sccm. In the arsenic ions 80 doped into the wafer 10 surface process, the energy of the doped arsenic ions 80 is about 200 to 10000 electric voltage and the dosage of the doped arsenic ions 80 is about per cubic centimeter 1E15 to 1E17. The proceeding time of the process is usually following the different depth of the junction and is about 30 to 180 seconds. The depth of the doped arsenic ions 80 is about 100 to 600 angstroms.

In order to make the arsenic ions 80 distribute in the wafer 10 surface more uniformly, the power supply 70 uses a pulse mode to provide the power. In other words, the first electrode board 55 and the second electrode board 60 bring the electric charges frequently to control the depth of the doped arsenic ions 80 in the wafer surface. When the first electrode board 55 and the second electrode board 60 bring the electric charges all the time, the concentration of the arsenic ions 80 will be increased continuously and the depth of the doped arsenic ions 80 will not be controlled easily. When the present invention method is used to make the first electrode board 55 and the second electrode board 60 bring the electric charges frequently, the concentration of the arsenic ions 80 is not increased following the proceeding time and the depth of the doped arsenic ions 80 is easily controlled. The pulse frequency of the power supply is about 0.1 to 10 seconds.

Figure 5:
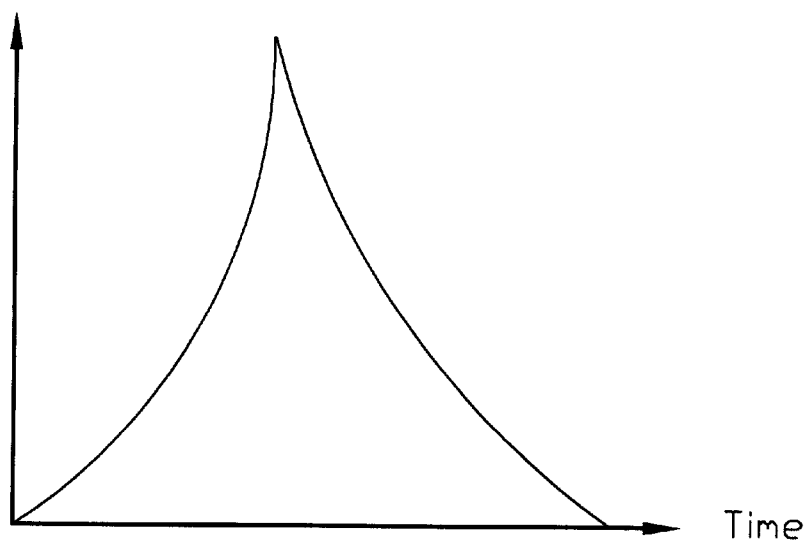
FIG. 5 shows a diagram in the spike anneal process.
Figure 6:
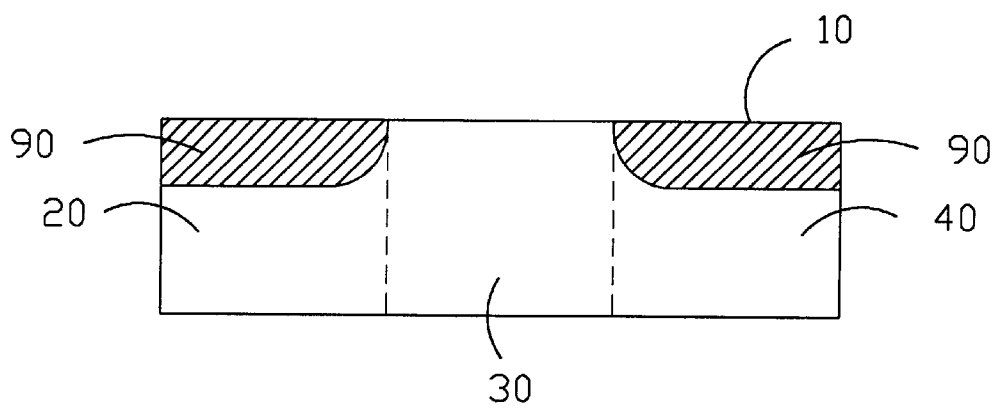
FIG. 6 shows a diagram in forming a ultra-shallow junction in the semiconductor substrate by using the present invention method.

After getting out the wafer 10 which has finished the plasma arsenic doping process from the chamber and removing the mask layer 50, the wafer 10 is placed in the tempering furnace to proceed the post anneal process. The post anneal process is a rapid thermal anneal process and the way of the rapid thermal anneal is a spike anneal. This anneal method is to prevent the arsenic ions 80 over diffusion and the junction region to be controlled hardly. Referring to FIG. 5, the spike anneal means that the increasing temperature velocity and the decreasing temperature velocity are very quickly and the temperature is not held in the anneal process. In other words, the holding time of the temperature is zero in the anneal process. The highest proceeding temperature of the process is about 1000 to 1200° C. and the proceeding time of the process is about 60 to 120 seconds when the wafer 10 proceeds the post anneal process. Referring to FIG. 6, there is the ultra-shallow junction 90, which is formed by using the present invention method in the p type substrate of the wafer 10. The thickness of the ultra-shallow junction 90 is about 300 to 600 angstroms.

Using the present invention method to dope the arsenic ions into the surface of the wafer by attracting and osmosis can decrease the condition that the material structure of the wafer surface is destroyed in the doping arsenic ions process. The amorphous layer of the wafer surface is very thin to be repaired in the post anneal process. This condition can decrease the proceeding time of the post anneal process and increase the efficiency of the process.

The way of traditional implanting ions is a single point mode. The present invention method is a plane mode to dope the arsenic ions into the wafer surface by attracting and osmosis. This method can make the concentrations of the doped arsenic ions distribute uniformly in the junctions, which are on the both sides of the gate. The doping depth of the arsenic is shallower and controlled easier. The arsenic ions can not be doped into the gate region of the semiconductor substrate. After finishing the post anneal process in the spike anneal mode, the resistance values of the junctions which are on the both sides of the gate are more uniform. The junction will become a ultra-shallow junction following the doped depth of the arsenic ions is shallower. The doped ions will not be over diffused into the gate region of the wafer substrate to affect the electricity of the semiconductor elements. Therefore, when the volume of the semiconductor element is reduced, we can use the present invention method to make the excellent electricity ultra-shallow junction.

In accordance with the present invention, The present invention provides a method for forming the ultra-shallow junction by using a arsenic plasma doping fashion to make ions dope into the surface of the wafer by attracting and osmosis. The depth of the doped ions will be controlled by the energy of the doped ions to form a very thin amorphous layer on the wafer surface. Using the present method will also not destroy the material structure of the wafer surface in seriously and the concentrations of the ions in the junctions are more uniform by the plane mode doping ions way. When the wafer, which is finished the arsenic process, passes through the post anneal process, the material structure of the wafer surface which is destroyed in the plasma arsenic doping process can be repaired in the very short time. This condition will decrease the proceeding time of the post anneal process and increase the throughput of the factory. The arsenic ions will not occur the over diffusion condition in the post anneal process. The over diffusion condition will cause the junction region over broadness to affect the electricity of the junction. Because the ions distributing in the junction are more uniformly, the resistance values of the junctions are more uniform. Therefore, the quality of the junction is increased and the junction region is decreased following the reduced volume of the semiconductor element successfully to become the ultra-shallow junction.

Although specific embodiments have been illustrated and described, it will be obvious to those skilled in the art that various modifications may be made without departing from what is intended to be limited solely by the appended claims.

What is claimed is:

1. A method for making an ultra-shallow junction, said method comprises:

provideing a wafer which comprises a substrate;

dividing said substrate into a gate region, a source region, and a drain region;

forming a mask layer on said gate region;

placing said wafer in a chamber which comprises a first electrode board, a second electrode board, and a power supply;

opening said power supply, said power supply providing a pulse mode power;

transmitting a gas which comprises an arsenic ion;

removing said mask layer; and placing said wafer in a tempering furnace to proceed a spike rapid thermal anneal process.

2. The method according to claim 1, wherein said substrate is a p type substrate.

3. The method according to claim 1, wherein a frequency of said pulse is 0.1 to 10 seconds.

4. The method according to claim 1, wherein said spike rapid thermal anneal process is a zero holding time of a temperature process.

5. A method for making an ultra-shallow junction, said method comprises:

providing a wafer which comprises a p type substrate;

dividing said substrate into a gate region, a source region, and a drain region;

forming a mask layer on said gate region;

placing said wafer in a chamber which comprises a first electrode board, a second electrode board, and a power supply;

opening said power supply, said power supply providing a pulse mode power;

transmitting a gas which comprises an arsenic ion;

removing said mask layer; and placing said wafer in a tempering furnace to proceed a spike rapid thermal anneal process, wherein said spike rapid thermal anneal process is a zero holding time of a temperature process.

6. The method according to claim 5, wherein a frequency of said pulse is 0.1 to 10 seconds.

7. The method according to claim 5, wherein a highest temperature of said rapid thermal anneal process is about 1000 to 1200° C.

8. The method according to claim 5, wherein a energy of said arsenic ion is about 200 to 10000 electric voltage.

9. The method according to claim 5, wherein said a dosage of said arsenic ion is about per cubic centimeter 1E15 to 1E17 said arsenic ions.

* * * * *